United States Patent [19]
Kawaguchi et al.

[11] Patent Number: 6,117,346
[45] Date of Patent: Sep. 12, 2000

[54] PROCESS FOR FORMING A MICROSTRUCTURE IN A SUBSTRATE OF A FERROELECTRIC SINGLE CRYSTAL

[75] Inventors: Tatsuo Kawaguchi, Motosu-Gun; Minoru Imaeda, Nagoya, both of Japan

[73] Assignee: NGK Insulators, Ltd., Nagoya, Japan

[21] Appl. No.: 09/033,733

[22] Filed: Mar. 3, 1998

[30] Foreign Application Priority Data

Mar. 4, 1997 [JP] Japan .................................. 9-048831

[51] Int. Cl.$^7$ .................................................. G02B 6/01
[52] U.S. Cl. .............................................. 216/24; 385/146
[58] Field of Search ........................... 385/146; 359/245, 359/250, 290, 291, 321, 322, 324; 216/24, 55, 87, 96, 101

[56] References Cited

U.S. PATENT DOCUMENTS 5,664,032  9/1997  Bischel et al. ................................. 385/4

FOREIGN PATENT DOCUMENTS 0 745 883 A1  4/1996  European Pat. Off. .

OTHER PUBLICATIONS

Iwasa: "Chemical etching and fabrication of ridge waveguides on $Bi_{12}GeO_{20}$," Journal of Applied Physics., vol. 47, No. 6, New York US, pp. 2746–2748, XP002073626.
Patent Abstracts of Japan vol. 15, No. 167 (C–0872), Apr. 26, 1991 & JP 03 037194 A (Sumitomo Metal Mining Co Ltd).
Patent Abstracts of Japan vol. 17, No. 643 (P–1651), Nov. 29, 1993 & JP 05 210132 A (Sony Corp.).
Patent Abstracts of Japan vol. 17, No. 291 (C–1067), Jun. 4, 1993 & JP 05 017295 A (Ibiden Company Ltd).

*Primary Examiner*—Randy Gulakowski
*Assistant Examiner*—Allan Olsen
*Attorney, Agent, or Firm*—Wall Marjama Bilinski & Burr

[57] ABSTRACT

A process for forming a microstructure at a surface of a substrate made of a ferroelectric single crystal, includes the steps of subjecting the substrate to a single-poling treatment, thereby one of an etching-easy surface and an etching-difficult surface being exposed to one of main faces of the substrate, while the other being exposed to the other main face, forming a domain-inverted region in at least one of the main faces of the substrate, and forming the microstructure at the substrate in the domain-inverted region of the substrate by selectively etching the substrate.

7 Claims, 3 Drawing Sheets

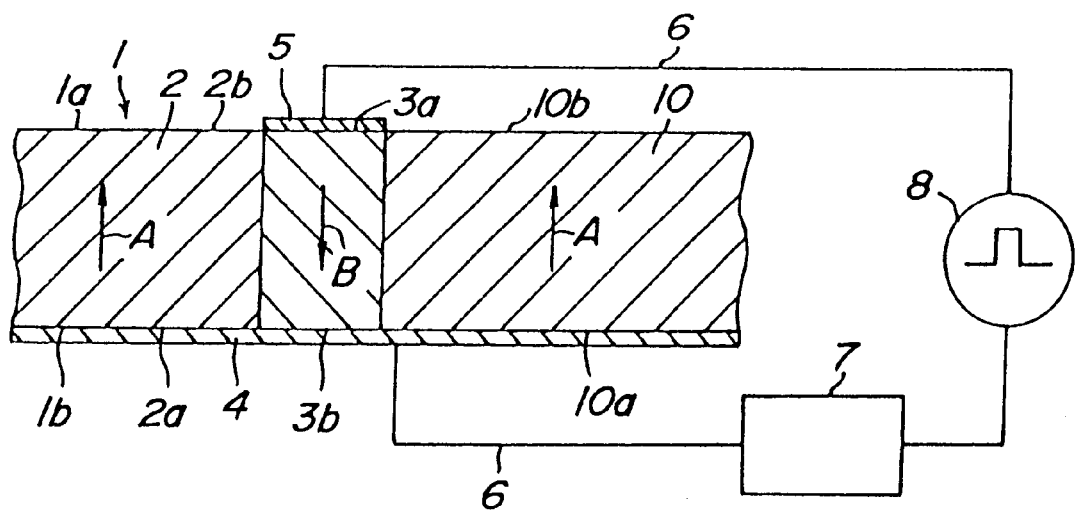
FIG_1a
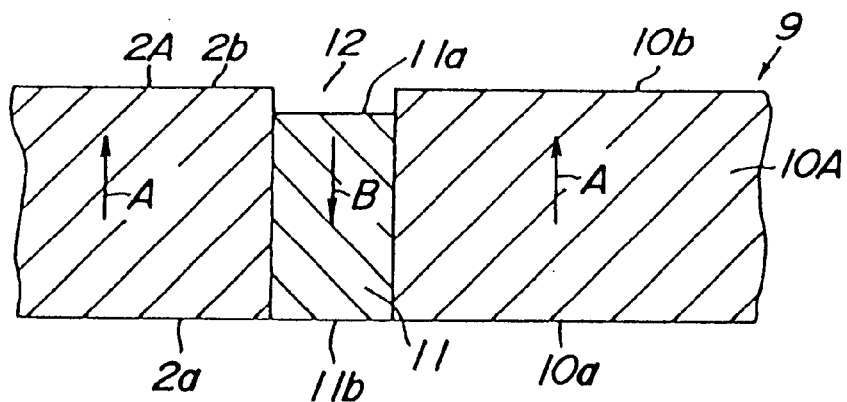
FIG_1b
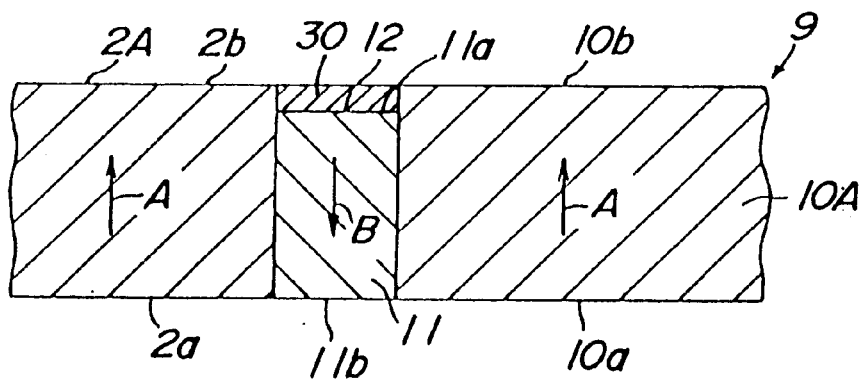
FIG_1c

FIG_3a
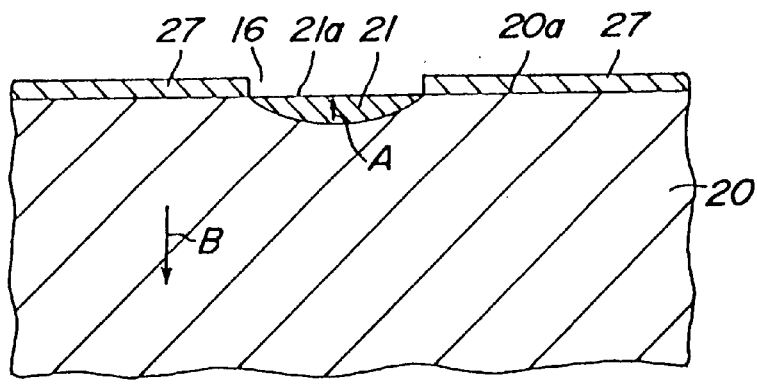
FIG_3b
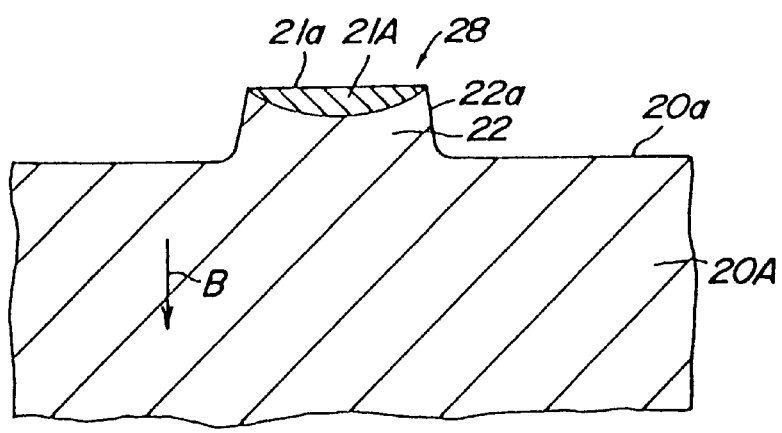
FIG_3c
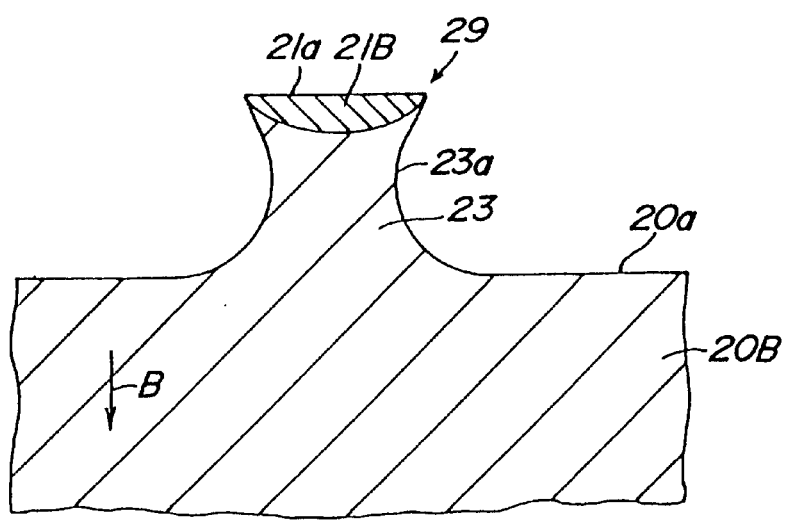

PROCESS FOR FORMING A MICROSTRUCTURE IN A SUBSTRATE OF A FERROELECTRIC SINGLE CRYSTAL

BACKGROUND OF THE INVENTION

1. Field of the Invention

The present invention relates to a process for forming in a ferroelectric a microstructure to be favorably used for an optical parts or the like.

2. Related Art Statement

In order to form a microstructure such as an optical waveguide layer on a surface of a ferroelectric single crystal substrate, a given protecting mask is formed on the surface of the substrate, and a portion of the substrate exposed outside through an opening of the mask is selectively etched (For example, see The Transaction of the Institute of Electronics, Information and Communication Engineers) C-1 Vol. J77-C-I No. 5 (1994) pp 229–237).

In this case, the dimensional precision, the configuration precision, the height, etc. of the microstructure depend mainly upon a difference in etching rate (selective ratio) between the material of the protecting mask and that of the substrate for an etching agent. For this reason, the selective ratio needs to be generally 1: not less than 1, preferably 1: not less than 10 so that the microstructure having practical dimensional precision and configuration precision.

However, it was difficult to work substrates made of ferroelectric single crystals such as lithium niobate single crystal and lithium tantalate single crystal, because there is unavailable an appropriate protective masking material giving such a high selective ratio for them. Therefore, it has been practically difficult to form a microstructure, such as a ridged optical waveguide layer or a micro recess, having a practical configuration precision and a practical dimensional precision on the surface of the ferroelectric single crystal.

SUMMARY OF THE INVENTION

It is an object of the present invention to provide a process for enabling a microstructure such as a ridged optical waveguide layer or a micro recess to be formed on a surface of a substrate made of a ferroelectric single crystal.

The present invention relates to a process for forming a microstructure at a surface of a substrate made of a ferroelectric single crystal, said process comprising the steps of subjecting the substrate to a single-poling treatment, thereby one of an etching-easy surface and an etching-difficult surface being exposed to one of main faces of the substrate, while the other being exposed to the other main face, forming a domain-inverted region in at least one of the main faces of the substrate, and forming the microstructure at the substrate in the domain-inverted region of the substrate by selectively etching the substrate.

Such a microstructure may be used as an optical part such as an optical waveguide layer or a piezoelectric material.

The present inventors reached a technical idea that a polarized substrate in which an etching-easy face exists in a polarized direction, while an etching-difficult face exists in the opposite direction is prepared to form a microstructure on the surface of the ferroelectric single crystal substrate as mentioned above, a domain-inverted region is formed at least in the substrate and then the substrate is subjected to selective etching. As a result, the present inventors succeeded in providing a process for forming the microstructure in a main face of a ferroelectric single crystal substrate in which a microstructure have been difficult to be formed, because any appropriate material having a high selective ratio has not been available for such a substrate.

In ferroelectric single crystal substrates, there exist crystalline faces which easily undergo etching with an etching agent (etching-easy faces) and crystalline faces which are difficult to be etched with the etching agent (etching-difficult faces). For example, as regards the lithium niobate single crystal substrate, the lithium tantalate single crystal substrate and the lithium niobate-lithium tantalate solid solution single crystal substrate, their +Z faces and +Y faces are etching-difficult faces for a mixed solution of fluoric acid and nitric acid, whereas their −Z faces and −Y faces are etching-easy faces for the mixed solution. The difference in etching rate between the etching-difficult face and the etching-easy face is of a very large value not less than 1: not less than 100.

The present inventors reached the technical idea that a microstructure such as an optical waveguide layer is on the surface of the ferroelectric single crystal substrate by utilizing the physical phenomenon that an etching-difficult face and an etching-easy face appear on the surface of the ferroelectric single crystal substrate when a domain-inverted region is formed in the ferroelectric single crystal substrate and that the etching rate conspicuously differs between the etching-difficult face and the etching-easy face.

It is known that the profile of a periodical domain-inverted structure is evaluated by the steps of forming the periodical domain-inverted structure on the surface of the ferroelectric single crystal substrate and then etching the surface of the substrate. However, it has not been known that the etching difficult face is used as a protecting mask based on the difference in etching ratio between the etching-difficult face and the etching-easy face of the substrate.

These and other objects, features and advantages of the invention will be appreciated upon reading of the following description when taken in conjunction with the attached drawings, with the understanding that some modifications, variations and changes of the same could be easily made by the skilled person in the art to which the invention pertains.

BRIEF DESCRIPTION OF THE DRAWINGS

For a better understanding of the invention, reference is made to the attached drawings, wherein:

FIGS. 1(a) through 1(c) are sectional views for schematically illustrating an embodiment of the invention process for the formation of a recess 12 and an optical waveguide layer 30 by utilizing an electric voltage-applying method;

FIGS. 3(a) through 3(c) are sectional views for schematically illustrating a further embodiment of the invention process for the formation of a ridged optical waveguide 29 by utilizing a Ti thermal oxidation method.

DETAILED DESCRIPTION OF THE INVENTION

Figure 2A:
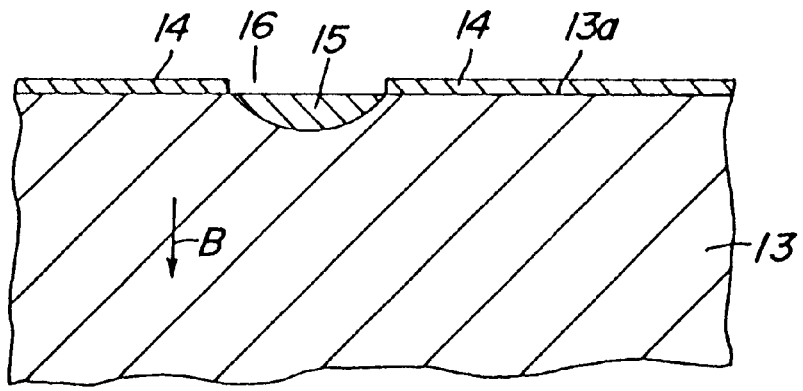
FIGS. 2(a) through 2(c) are sectional views for schematically illustrating another embodiment of the invention process for the formation of a ridged optical waveguide 26 by utilizing a proton-exchanging method.

Specific embodiments of the present invention will be explained with reference to the drawings.

As the material to be used for the substrate in the present invention, mention may be made of $LiNbO_3$, $LiTaO_3$, lithium niobate-lithium tantalate solid solution, KLN ($K_3Li_2Nb_5O_{15}$), KLNT ($K_3Li_2(Nb,Ta)_5O_{15}$) and these compounds in which at least one element selected from the group consisting of rare earth elements such as neodymium and erbium, magnesium and zinc is incorporated.

As the etching agent to be used for the above etching treatment, for example, a wet etching agent such as a mixture of hyrdofluoric acid and nitric acid may be used. Alternatively, a drying etching agent such as $CF_4$, $C_2F_6$, or $C_3F_8$ may be used.

In the present invention, if an etching-easy surface is exposed at the domain-inverted region on the main face of the substrate, a recess may be formed in the domain-inverted region by selectively etching the substrate. Further, an optical waveguide layer may be formed of a ferroelectric singe crystal having a refractive index greater than that of the substrate may be formed inside the recess.

If an etching-difficult surface is exposed at the domain-inverted region on the main face of the substrate, a ridged optical guidewave may be formed in the domain-inverted region by selectively etching the substrate.

In order to form the domain-inverting region at least in the surface area of the ferroelectric single crystal substrate, either one of methods described in, for example, a literature "LiNbO$_3$ quasi-phase matched SHG devices" of "Laser Research" Vol. 2, No. 11, pp 21–29 may be employed.

A domain-inverted portion may be formed over the entire thickness of a ferroelectric single crystal substrate by forming electrodes on opposite main faces of the substrate having undergone the single-poling treatment and then applying voltage between the electrodes. FIGS. 1(a) through 1(c) illustrate this embodiment by way of example.

FIG. 1(a) shows a ferroelectric single crystal substrate 1 having undergone the single-poling treatment, for example, as polarized in an arrow A direction. An electrode 5 is formed on one main face 1a of the substrate 1, and a common electrode 4 formed on the other main face 1b. An ammeter 7 and a power source 8 are connected to each electrode through an electric wire 6. In this state, when a given voltage is applied between the separated electrode 5 and the common electrode 4, a domain-inverted region 3 is formed, which is polarized in an arrow B direction. An etching-difficult face is located at a side of the main face 1a, whereas an etching-easy face is located at a side of the other main face 1b.

The above voltage-applying method is described in a literature "Fabrication of Ferroelectric Domain-Inverted Gratings for LiNbO$_3$ SHG Devices by Applying Voltage" in Electric Information Communication Academy Journal (The Transaction of the Institute of Electronics, Information and Communication Engineers) C-1 Vol. J78-C-I No. 5 (1995) pp 238–245).

The substrate is kept polarized in the arrow A direction at portions 2 and 10 not which are domain-inverted. In this embodiment, 2a and 10a denote the etching-easy faces, whereas 2b and 10b denote the etching-difficult face. In contrast, in the domain-inverted region 3, 3a denotes the etching-easy face, whereas 3b denotes the etching difficult face. Therefore, the etching difficult faces 2b and 10b are exposed at opposite sides of the etching-easy face 3a, respectively.

Next, after the electrodes 4 and 5 are removed from the substrate by a conventional process, the substrate is subjected to given etching, thereby obtaining the resultant substrate 9 shown in FIG. 1(b). In this substrate 9, the etching-difficult faces 2b and 10b at the portions 2A and 10A which are not domain-inverted are merely slightly etched, whereas the domain-inverted region is greatly etched with a recess 12 formed. In this embodiment, a reference numeral 11 denotes the domain-inverted region, in which 11a and 11b denote an etching-easy face and an etching-difficult face, respectively.

Then, as shown in FIG. 1(c), an epitaxial film 30 is formed of a ferroelectric single crystal within the recess 12 of the substrate 9 by the liquid phase epitaxial method. At that time, the epitaxial film 30 may be used as an optical waveguide layer, if the refractive index of the epitaxial film 30 is set to less than that of the ferroelectric single crystal substrate.

Various specific liquid phase epitaxial processes are known. In the event that the substrate is made of a single crystal made of lithium niobate, lithium tantalate, or lithium niobate-lithium tantalate solid solution, a melt with which the substrate is to be contacted is preferably selected from $Li_2O$, $Nb_2O_5$, $Ta_2O_5$ or flux. As the flux, $V_2O_5$, $B_2O_3$, $MoO_3$ and $WO_3$ are preferred.

Further, by using an electron beam scanning method, a domain-inverted region may be formed in a substrate in the same manner as in the voltage-applying method in FIGS. 1(a) through 1(c). In the electron beam scan irradiating method, for example, while a +Z face of a Z-cut LiNbO$_3$ or LiTaO$_3$ is grounded, a condensed electron beam is scanned and irradiated at ordinary temperature upon its −Z face provided with no electrode. Therefore, domain inversion occurs in a region of the single crystal immediately under a scanned line down to a rear face thereof. Such a method is described in "Optical Review" Sample Issue 1994, pp 36–38.

Figure 2B:
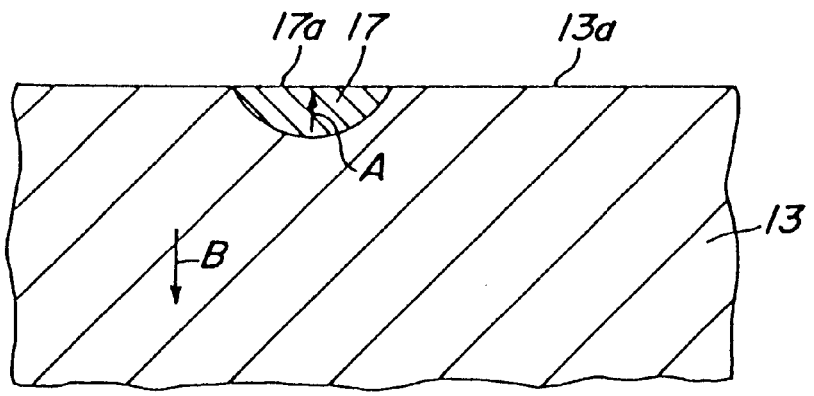
Figure 2C:
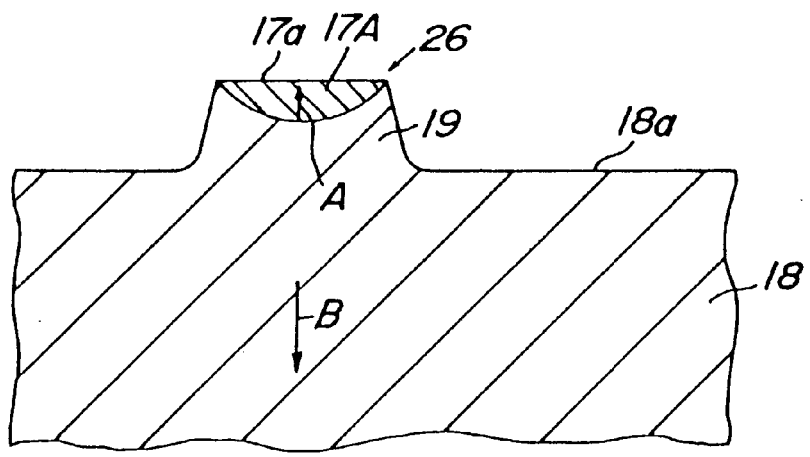

Referring to FIGS. 2(a) through 2(c) a domain-inverted region is formed in a ferromagnetic single crystal substrate by a proton-exchange and heat treatment. As shown in FIG. 2(a), the single crystal 13 is polarized in an arrow B direction. One main face 13a is an etching-easy face. Then, a given mask pattern 14 is formed on the etching-easy face 13a, while a gap 16 is formed in the mask pattern. The mask pattern 14 may be formed according to a conventional method. As a material to form the mask, Ta, W, Ti, Au, SiO$_2$ or Ta$_2$O$_5$ may be recited by way of example. In order to form a mask pattern from a film of such a material, a photolithography method may be recited. After that, a proton-exchanged portion 15 is formed at the gap 16 by subjecting the substrate 13 to the proton-exchanging treatment.

Thereafter, as shown in FIG. 2(b), a domain-inverted region 17 is formed by thermally treating the proton-exchanged portion 15. The domain-inverted region 17 is polarized in an arrow A direction, and an etching-difficult face 17a is exposed.

Proton exchange is typically effected at a −Z face 13a of an LiTaO$_3$ single crystal substrate 13 with pyrophoshoric acid at around 26C° C., and the substrate is subsequently thermally treated at 500 to 600° C. As a result, the polarized direction is inverted inside the proton-exchanged layer. Such a method is described in "Journal of Applied Physics" No. 73(3), pp 1390–1394, Feb. 1, 1993.

Next, the substrate 13 is etched, thereby obtaining the substrate 18 as shown in FIG. 2(c). In this substrate 18, the etching-easy face side 13a is progressively etched to expose the etching-easy face 18a outside, whereas an etching-difficult face 17a is almost not etched. Consequently, a ridged optical waveguide layer 26 is formed at the domain-inverted region 17A having the etching-difficult face 17a. The optical waveguide layer 26 includes the domain-inverted region 17A and a domain non-inverted region 19 under the domain-inverted region 17A, and projects upwardly beyond the etching-easy face 18a.

Referring to FIGS. 3(a) through 3(c) a domain-inverted region is formed in a ferroelectric single crystal substrate by a Ti thermal oxidation method. As shown in FIG. 3(a), the single crystal 20 is polarized in an arrow B direction, and one main face 20a is an etching-easy face. Then, a given pattern of a titanium thin film is formed on the etching-easy face 20a, while a gap 16 is formed between the titanium thin film portions.

Thereafter, the thin film of titanium is converted to a thin film of titanium oxide 27 through oxidation by thermally treating the titanium thin film at, for example, around 500° C. During the thermal treatment, a domain-inverted region 21 is formed at the gap 16 between the thin film portions 27 of titanium oxide such that an etching-difficult face 21a of the domain-inverted region is exposed outside. Such a treatment is described in "ELECTRONICS LETTERS" Vol. 28, No. 17, Aug. 13, 1992, pp 1594–1596.

Next, the substrate 20 is converted to a state shown in FIG. 3(b) by etching the substrate. In the substrate as shown, while the etching-easy face 20a is progressively etched, the etching-difficult face 21a is almost not etched. For this reason, a projection 28 is formed at the domain-inverted region 21A having the etching-difficult face 21a. The projection 28 includes the domain-inverted portion 21A and a domain non-inverted portion 22.

Although etching may be stopped in this state, the substrate is further etched in this embodiment to obtain a projection 29 shown in FIG. 3(c). In the substrate 20B shown, the etching-easy face 20a is further etched, but the etching-difficult face 21a is almost not etched. A surface portion 22a (FIG. 3(b)) of the domain non-inverted portion 22 is slightly etched.

In the projection 29 thus formed, a domain non-inverted portion 23 is formed under the domain-inverted region 21B having the etching-difficult face 21a. At that time, as the etching of the surface 22a (FIG. 3(b)) of the domain non-inverted portion 22 is advanced, the width between the surfaces 23a of the domain non-inverted portion 23 becomes smaller than that of the domain-inverted portion 21B. That is, the projection 29 includes the almost planar domain-inverted region 21B and the domain non-inverted, throttled domain non-inverted support portion 23 supporting the domain-inverted region 21B. The projection 29 having such a configuration may be used as an optical waveguide or an arm for a piezoelectric oscillator.

In the step for the formation of the domain-inverted region, a titanium indiffusion method, an $Li_2O$ outdiffusion method, and an $SiO_2$ cladding/annealing method may be recited by way of example besides the above-mentioned ones.

Further, in the present invention, it may be that numerous recesses 12 as shown in FIG. 1 are formed in a given interval at a surface of a substrate made of ferroelectric single crystal, and a periodic domain-inverted structure is formed by forming an epitaxial layer 30 in each of the recesses 12 as mentioned above.

As a blue laser light source to be used for an optical pickup or the like, a second harmonic generation device of a quasi-phase matched (QPM) type using a periodic domain-inverted structure of a lithium niobate or lithium tantalate single crystal with optical waveguides may be used. Such devices may be widely applied to optical disc memory, medical uses, optochemical uses, and various optical measurements, etc.

(Experiments)

In the following, further specific experimental results are explained.

EXAMPLE 1

According to the process illustrated with reference to FIGS. 1(a) to 1(c), an optical waveguide layer was formed. More specifically, aluminum electrodes 4 and 5 were formed on a +Z face of a substrate 1 made of a lithium niobate single crystal having an optical grade in a thickness of 0.5 mm, and domain-inverted regions and domain non-inverted regions were successfully alternately provided by applying voltage of 10 kV between the electrodes. The width of the domain-inverted region 3 was about 5 µm, and that of the domain non-inverted portion 2, 10 was also about 5 µm. The domain-inverted regions extended slenderly and straight in a striped pattern.

The thus obtained substrate was etched in a mixed solution of hydrofluoric acid and nitric acid (1:2) at about 100° C. for 40 minutes, thereby forming recesses 12 as shown in FIG. 1(b). Each recess 12 had a width of about 5µ and a depth of 3 µm.

Then, an epitaxial film 30 was formed in each of the recesses 12 by the liquid phase epitaxial method. More specifically, a pseudo-ternary melt of $LiNbO_3$—$LiTaO_3$—$LiVO_3$ was prepared. This melt was converted to a fully uniform liquid phase by stirring at a sufficiently high temperature (1100° C. to 1300° C.) for not less than 3 hours. Then, after the melt was cooled to 1010° C., it was held at this temperature for not less than 12 hours. As a result, nuclei of a solid solution corresponding to a supersaturated portion occurred, and a solid phase precipitated on the wall surface of a crucible. At that time, the liquid phase portion of the melt was in a saturated state at 1010° C., and the melt includes this liquid phase portion and the solid phase portion in a coexistent state.

Thereafter, the melt was cooled from 1010° C. to a film-forming temperature. A film was formed in each recess of the substrate 9 of the lithium niobate by contacting it with the liquid phase portion. The thus obtained epitaxial film 30 had a composition of Ta/(Nb+Ta)=0.4. The epitaxial film 30 is used as an optical waveguide.

EXAMPLE 2

According to the above process illustrated with reference to FIGS. 2(a) through 2(c), ridged optical waveguides were formed. More specifically, a film of tantalum was deposited in a thickness of 60 nm on a −Z face 13a of a substrate of a Z-cut lithium tantalate single crystal 13 having an optical grade by sputtering. Then, a patterning was effected on the resulting substrate by photolilthography. A given mask pattern 14 was formed by dry etching the substrate in a $CF_4$ atmosphere. The resulting substrate 13 was placed in pyrophoshoric acid where proton exchange was effected at 260° C. for 60 minutes, thereby forming a proton exchanged portion having a width of about 8 µm and a depth of about 2 µm.

A domain-inverted region 17 was formed by thermally treating the proton-exchanged portion 15 at 550° C.

Then, the substrate 13 was immersed in an etching solution of $HF:HNO_3=1:2$ at 100° C. for 1 hour, thereby forming a ridged optical waveguide 26 having a width of about 8 µm and a height of about 5 µm.

EXAMPLE 3

According to the above process illustrated with reference to FIGS. 3(a) through 3(c), ridged optical waveguides 29 were formed. More specifically, about 3 µm-wide titanium thin film portions and about 10 µm-wide gap portions 16 were alternately formed on a −Z face 20a of a substrate 20 of a Z-cut lithium niobate single crystal having an optical grade. Domain-inverted layer portions 21 each having a width of about 10 μm and domain non-inverted portions each having a width of about 3 μm were alternately formed by oxidizing the titanium thin film portions through thermal treatment at about 500° C. The thickness of each domain-inverted portion 21 was about 1 μm.

After the titanium oxide thin film portions 27 were removed from the substrate 20, the substrate 20 was immersed in an etching solution of $HF:HNO_3=1:2$ at 100° C. for 2 hours, thereby forming ridged optical waveguides having a width of about 10 μm and a height of about 5 μm as shown in FIG. 3(c).

As mentioned above, the present invention can provided a novel process for the formation of a microstructure at the surface of the substrate made of the ferroelectric single crystal made of lithium niobate, lithium tantalate or the like.

What is claimed is:

1. A process for forming a ridged optical waveguide layer at a surface of a substrate made of a ferroelectric single crystal, said process comprising the steps of:

subjecting the substrate to a single-poling treatment, thereby exposing at least one of an etching-easy surface and an etching-difficult surface to one of the main faces of the substrate, while exposing the other of said at least one of an etching-easy surface and an etching-difficult surface to the other main face of said substrate;

forming a domain-inverted region in at least one of the main faces of the substrate, wherein said etching-difficult surface is exposed at the domain-inverted region in one of the main faces of the ferroelectric single crystal substrate; and forming said ridged optical waveguide layer at the substrate in the domain-inverted region of the substrate by selectively etching the substrate.

2. The process set forth in claim 1, wherein said microstructure is to be used as an optical element.

3. The process set forth in claim 1, wherein an etching-easy face is exposed at the domain-inverted region in one of the main faces of the ferroelectric single crystal substrate, and a recess is formed in the domain-inverted region by selectively etching the substrate.

4. The process set forth in claim 3, wherein an optical waveguide layer is formed in said recess, said optical waveguide layer being comprised of a ferroelectric single crystal having a refractive index larger than that of said ferroelectric single crystal substrate.

5. The process set forth in claim 1, wherein the ridged optical waveguide layer is located on a projected portion of the domain-inverted region, wherein said projected portion includes at least one concave surface.

6. The process set forth in claim 1, wherein the ferroelectric single crystal substrate is composed of one compound selected from the group consisting of $LiNbO_3$, $LiTaO_3$, a lithium niobate-lithium tantalate solid solution, $K_3Li_2Nb_5O_{15}$, $K_3Li_2(Nb,Ta)_5O_{15}$ and these compounds in which at least one element selected from the group consisting of rare earth elements, magnesium and zinc is incorporated.

7. The process set forth in claim 1, wherein the domain-inverted region is formed by one method selected from the group consisting of an electric voltage-applying method, an electron beam scanning method, a proton-exchange heat treatment method, a titanium thermal oxidation method, a titanium indiffusion method, an $Li_2O$ outdiffusion method, and an $SiO_2$ cladding/annealing method.

* * * * *